(12) United States Patent
Severgnini et al.

(10) Patent No.: US 11,431,286 B2
(45) Date of Patent: Aug. 30, 2022

(54) SOLAR CELL ASSEMBLIES EXHIBITING ARTIFICIAL TROPISM

(71) Applicant: TOYOTA MOTOR ENGINEERING & MANUFACTURING NORTH AMERICA, INC., Plano, TX (US)

(72) Inventors: Frederico Marcolino Quintao Severgnini, Ann Arbor, MI (US); Ercan Mehmet Dede, Ann Arbor, MI (US); Sean P. Rodrigues, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 16/799,776

(22) Filed: Feb. 24, 2020

(65) Prior Publication Data

US 2021/0265943 A1 Aug. 26, 2021

(51) Int. Cl.
*H01L 31/042* (2014.01)
*H02S 20/32* (2014.01)
(Continued)

(52) U.S. Cl.
CPC .............. *H02S 20/32* (2014.12); *B60L 8/003* (2013.01); *B60L 53/22* (2019.02); *H02S 40/22* (2014.12)

(58) Field of Classification Search
CPC .......... H02S 20/32; H02S 40/22; B60L 53/22; B60L 8/003
See application file for complete search history.

(56) References Cited

U.S. PATENT DOCUMENTS 8,921,473 B1 * 12/2014 Hyman ..................... C08K 3/04
524/445
2010/0170557 A1 * 7/2010 Barnett ............... H01L 31/0549
136/244

(Continued)

FOREIGN PATENT DOCUMENTS

JP 2010219318 9/2010

OTHER PUBLICATIONS

Baytekin, B. et al., Artificial Heliotropism and Nyctinasty Based on Optomechanical Feedback and No Electronics, SoRo, Soft Robotics, vol. 00, No. 00, 2017, 6 pgs.

(Continued)

*Primary Examiner* — Thanh Trug Trinh
(74) *Attorney, Agent, or Firm* — Sheppard, Mullin, Richter & Hampton LLP; Hector A. Agdeppa; Daniel N. Yannuzzi

(57) ABSTRACT

A solar cell assembly is provided, the configuration of which effectuates artificial tropism. The solar cell assembly may include a combination of at least one transparent solar cell and at least one opaque solar cell. The at least one transparent solar cell may transmit some wavelength(s) of incident sunlight while the at least one opaque solar cell may transmit some wavelength(s) of incident sunlight and absorbing some other wavelength(s) of incident sunlight. The transmitted wavelength(s) of incident sunlight excite or cause one or more shape-changing elements that support the at least one transparent solar cell and the at least one opaque solar cell to actuate in a manner that causes the solar cell assembly to re-orient itself towards a direction of the incident sunlight.

20 Claims, 8 Drawing Sheets

(51) Int. Cl.
    *B60L 8/00*           (2006.01)
    *B60L 53/22*         (2019.01)
    *H02S 40/22*        (2014.01)

(56) References Cited

U.S. PATENT DOCUMENTS

| | | | |
|---|---|---|---|
| 2013/0319498 A1* | 12/2013 | Song | B60J 7/043 |
| | | | 136/244 |
| 2014/0238488 A1* | 8/2014 | Jiang | H02S 20/32 |
| | | | 136/259 |
| 2015/0037517 A1* | 2/2015 | Buriak | B05D 3/12 |
| | | | 427/600 |

OTHER PUBLICATIONS

Svetozarevic, B. et al., Dynamic photovoltaic building envelopes for adaptive energy and comfort management, Nature Energy, Published online, Jul. 8, 2019, 12 pgs.

Wang, Ch. et al., Soft Ultrathin Electronics Innervated Adaptive Fully Soft Robots, Advanced Materials, Adaptive Soft Robots, Adv. Mater. 2018, 30, 1706695, 9 pgs.

Qian, X., et al., Artificial phototropism for omnidirectional tracking and harvesting of light, Nature Nanotechnology, Nov. 4, 2019, 9 pgs., vol. 14.

* cited by examiner

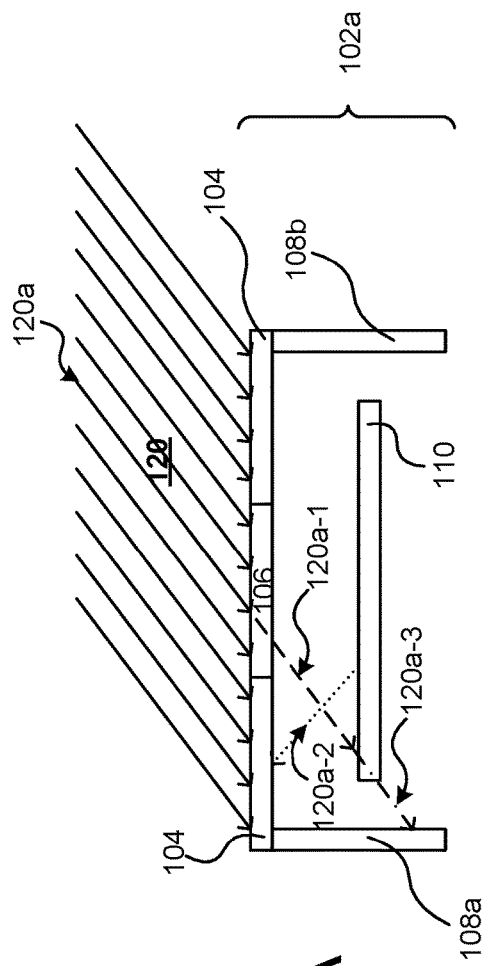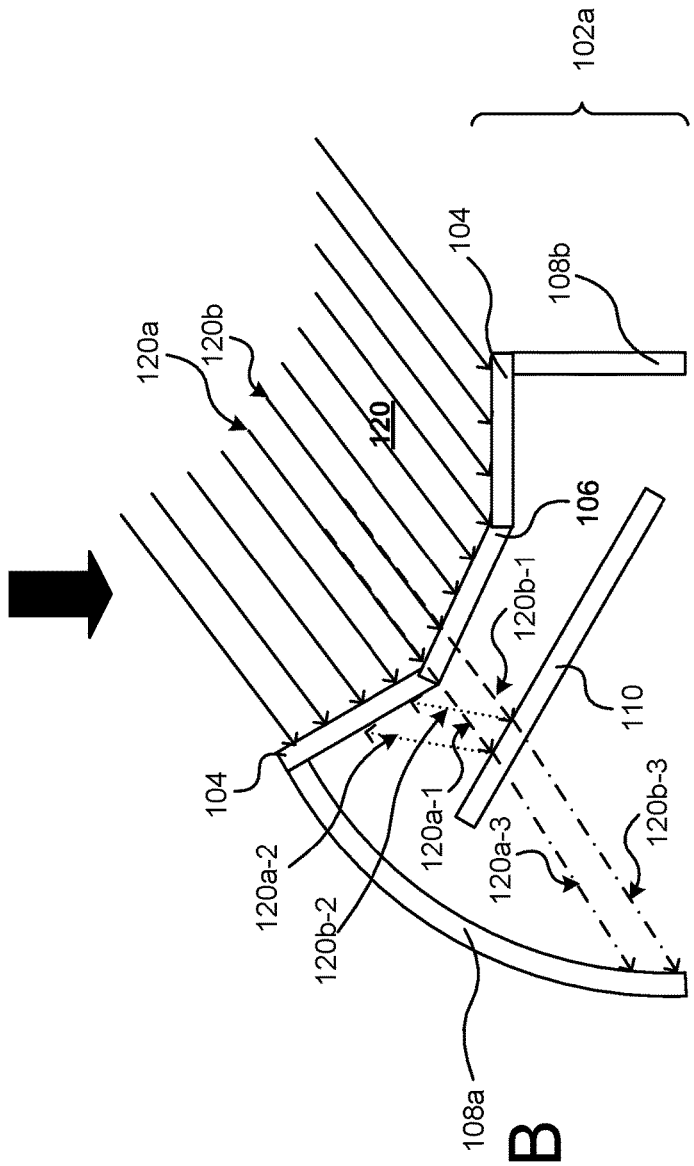

SOLAR CELL ASSEMBLIES EXHIBITING ARTIFICIAL TROPISM

TECHNICAL FIELD

The present disclosure relates generally to optimizing solar cell performance through the use of flexible solar cell assemblies that can bend to absorb more sunlight, providing solar energy that may be used to power, e.g., a vehicle battery.

DESCRIPTION OF RELATED ART

Some vehicle manufacturers have begun utilizing alternative power sources to improve fuel economy, as well as improve the overall operating efficiency and environmental performance of their vehicles. One such type of alternative power source is solar power. Solar power is a renewable energy source, and can be harnessed through the use of solar cells that convert light energy of the sun into electrical energy (photovoltaic power generation).

Solar cells can be incorporated into a vehicle's roof as the roof of a vehicle is an area that generally experiences the most exposure to the sun (versus, for example, the side panels/doors of the vehicle). However, even though the roof of a vehicle often experiences the greatest sun exposure, the solar power that can be captured may only be capable of charging a small portion of a vehicle's power storage device (e.g., battery) due to a variety of factors, including the angle of incidence on the solar cells. That is, the operation of conventional solar cell-equipped vehicles roofs can be hampered by conditions that impede exposure of the solar roof to the sun, e.g., when the vehicle is parked inside a garage, when the vehicle is being operated in cloudy or less-than-ideal weather, and again, the position of one or more solar cells on a vehicle's roof (by virtue of the vehicle's location relative to the sun).

BRIEF SUMMARY OF THE DISCLOSURE

In accordance with one embodiment, a solar cell assembly adapted to passively track the sun comprises at least one opaque solar cell surrounding a transparent solar cell. The transparent solar cell and the opaque solar cell form a solar absorption section having a first surface facing incident sunlight, and a second surface opposite the first surface. A cold mirror may be disposed beneath the second surface of the solar absorption surface. The cold mirror splits the incident sunlight passing through the transparent solar cell into a first set of one or more beams that are reflected back to the opaque solar cell at the second surface, and a second set of one or more beams that are passed through the cold mirror and that actuate at least one shape-changing element supporting a first portion of the solar absorption section. Upon actuation of the at least one shape-changing element, the first portion of the solar absorption section is oriented such that the incident sunlight contacts the first surface substantially perpendicularly.

In some embodiments, the at least one shape-changing element comprises a liquid crystal elastomer, and wherein the second set of the one or more beams stimulates the liquid crystal elastomer. In some embodiments, the liquid crystal elastomer, when actuated at least one of increases in length and curves toward a direction of the incident sunlight.

In some embodiments, the solar cell assembly further comprises at least one other shape-changing element to support a second portion of the solar absorption section. In some embodiments, the at least one other shape-changing element remains in an un-actuated state. In some embodiments, upon a direction from which the incident sunlight originates changing, a third set of one or more beams that are passed through the cold mirror actuate the at least one other shape-changing element. In some embodiments, the at least one other shape-changing element, when actuated, at least one of increases in length and curves toward the changed direction from which the sunlight originates. In some embodiments, the at least one shape-changing element transitions to an un-actuated state.

In some embodiments, the at least one shape-changing element comprises a polymer, the polymer capable of being excited by the second set of the one or more beams that are passed through the cold mirror, the excitation of the polymer resulting in the actuation of the polymer.

In some embodiments, the at least one shape-changing element comprises a shape-memory alloy, the shape-memory alloy capable of being excited by the second set of the one or more beams that are passed through the cold mirror, the excitation of the shape-memory alloy resulting in the actuation of the shape-memory alloy.

In some embodiments, the solar cell assembly further comprises a cold support member supporting the cold mirror such that an orientation of the cold mirror relative to the second surface of the solar absorption surface remains substantially constant throughout the actuation of the at least one shape-changing element.

In some embodiments, the cold mirror support member comprises a material whose characteristic transparency matches that of the transparent solar cell.

In some embodiments, the solar cell assembly further comprises a plurality of cold mirror support members supporting the cold mirror such that an orientation of the cold mirror relative to the second surface of the solar absorption surface remains substantially constant throughout the actuation of the at least one shape-changing element.

In some embodiments, each of the plurality of cold mirror support members comprises a material whose characteristic transparency matches that of the transparent solar cell.

In accordance with another embodiment, a vehicle comprises a roof, and a solar cell array located on a surface of the roof. The solar cell array may comprise at least one solar cell assembly. The at least one solar cell assembly may comprise at least one opaque solar cell, and at least one transparent solar cell, the at least one transparent solar cell and the at least one opaque solar cell forming a first surface facing the incident sunlight. The at least one solar cell assembly may comprise a cold mirror positioned relative to a second surface of the solar absorption surface. The cold mirror reflects a first wavelength of the incident sunlight passing through the at least one transparent solar cell towards the at least one opaque solar cell, and transmits a second wavelength of the incident sunlight. The second wavelength of the incident sunlight causes at least one shape-changing element to undergo conformation such that the first surface is oriented towards the direction of the incident sunlight.

In some embodiments, the at least one shape-changing element comprises at least one of a liquid crystal elastomer reactive to light stimuli, a photopolymer reactive to light stimuli, and a shape-changing element.

In some embodiments, the at least one solar cell assembly further comprises at least one cold mirror support member maintaining the cold mirror's position relative to the second surface of the solar absorption surface.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 3A illustrates solar beams incident on the example solar cell of FIG. 2A in its resting state.

FIG. 3B illustrates solar beams incident on the example solar cell of FIG. 2A in its excited state.

Figure 1A:
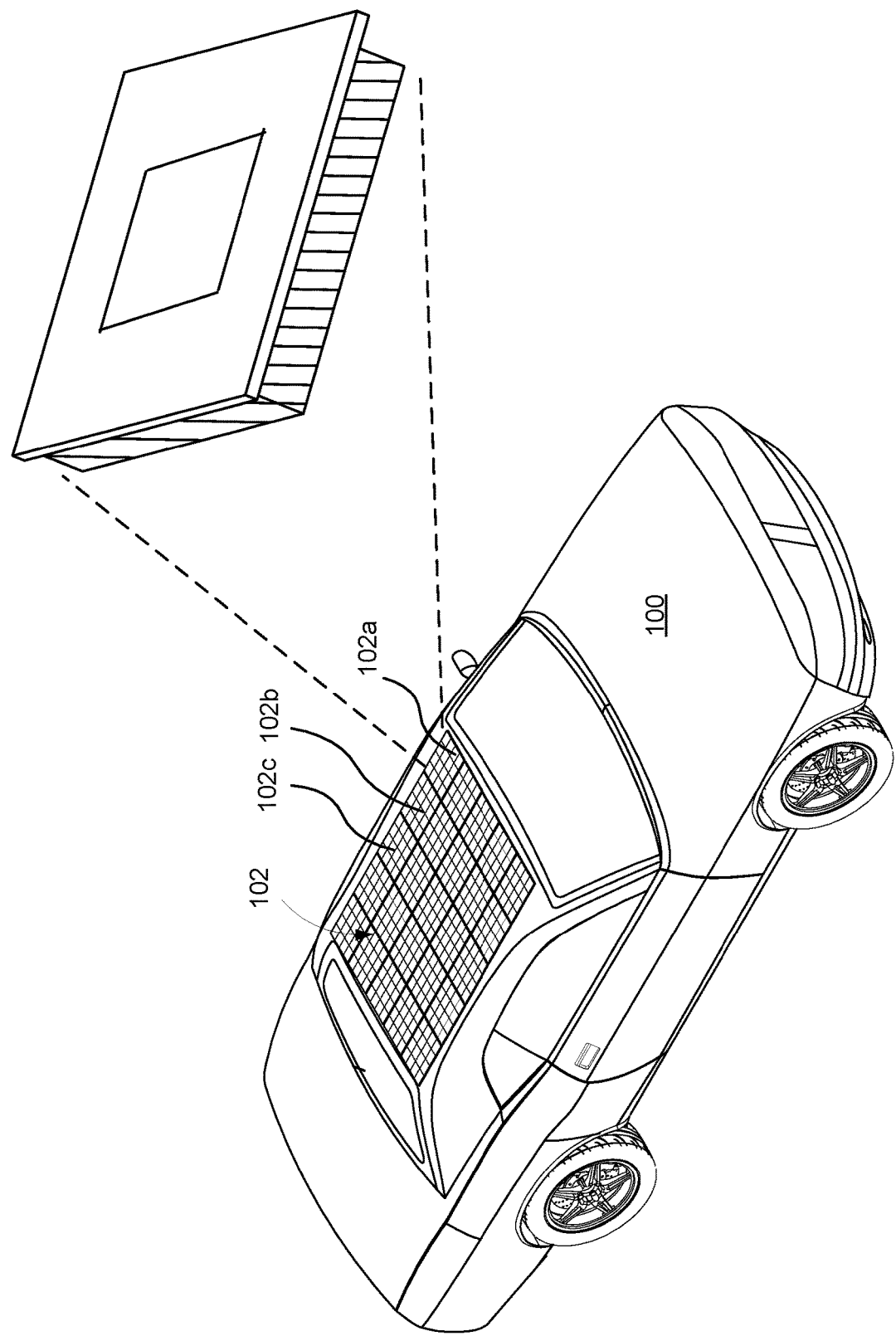
FIG. 1A is a graphical illustration of an example solar cell array on vehicle roof, wherein the solar cells of the solar cell array are in a resting state in accordance with various embodiments.

The figures are not exhaustive and do not limit the present disclosure to the precise form disclosed.

DETAILED DESCRIPTION

As alluded to above, vehicles may leverage solar energy to charge a vehicle's battery, power one or more vehicle systems, etc. However, the effectiveness with which a solar cell may capture solar energy from the sun depends on the positioning of the solar cell relative to the sun (or other solar energy source). Various embodiments of the present disclosure are directed to optimizing solar energy collection through artificial heliotropism (or more generally, tropism) where a solar or photovoltaic (PV) cell assembly can be made to bend towards the direction of a solar energy source, i.e., the sun.

In particular, one or more elastomer elements, and a dielectric mirror, e.g., a cold mirror, may be operatively combined with a solar cell assembly that relies on incident sunlight to both actuate the elastomer elements and act as the solar energy source from which solar energy may be captured via the solar cell assembly. For example, a combination of transparent and opaque solar cells or solar cell regions may be supported by one or more elastomer elements. When actuated by incident solar beams, by way of one or more portions/wavelengths of the solar beams redirected by a cold mirror, the one or more elastomer elements activate or transition to an excited or actuated state. As a result, the transparent and/or opaque solar cells can be made to bend or orient/re-orient themselves to better align themselves with the sun/optimize solar energy capture.

Elastomers are polymers with viscosity and elasticity (i.e., viscoelasticity), with properties allowing considerable molecular reconformation without breaking the covalent bonds holding the atoms together. Because of these properties, elastomers can be used to create structures that change shape by the application of fluidic force, heat, electricity, and/or magnetism, among other stressors. When such external force is applied to put the elastomer under stress, the molecules of the elastomer rearrange into an intended shape.

In accordance with one embodiment of the present disclosure, one or more elastomer elements used to orient a solar cell assembly towards a solar energy source may comprise one or more liquid crystal elastomer (LCE) structures or elements. LCEs can refer to slightly crosslinked liquid crystalline polymer networks capable of combining the entropy elasticity of an elastomer with the self-organization of a liquid crystalline phase. In the temperature range of the liquid crystalline phase, the mesogen's (compounds that display liquid crystal properties) orientation forces the polymer chains into a stretch conformation. By heating an LCE above the clearing temperature, this stretch conformation is lost, and the polymer backbone of the mesogen can relax into a random coil conformation that results in macroscopic, reversible deformation. In some cases, light-responsive actuation (e.g., from a solar energy source) can be effectuated by incorporating azobenzenes in the liquid crystalline phase.

Accordingly, LCEs are leveraged in accordance with various embodiments to orient a solar cell assembly towards the sun in a form of artificial heliotropism. Certain living organisms may track light sources and halt their movement when alignment with the light source is achieved. For example, plants, exhibit heliotropism by self-orienting themselves to face the sun throughout the day. Solar cell assemblies configured in accordance with various embodiments can mimic such heliotropism to orient themselves towards the sun, optimizing solar energy collection.

In a vehicle with solar cells, for example, the vehicle's battery can be recharged with the energy recouped by the solar cells so as to maintain the battery at an optimal state of charge (SOC). Fuel economy of the vehicle can be maximized by having the ability to use the vehicle's motor/generator (MG), which is powered by the battery, more frequently. Further still, the environmental impact of a hybrid electric vehicle (HEV), for example, can be lessened, and the overall operating efficiency of the vehicle can be increased. In some embodiments, the recouped energy can be used to power certain systems or devices of the vehicle, e.g., the vehicle's air conditioning system. For example, using the energy recouped through the vehicle's solar cells, the vehicle's air conditioning system can be autonomously operated to gradually cool the vehicle in hotter weather.

It should be noted that the terms "optimize," "optimal" and the like as used herein can be used to mean making or achieving performance as effective or perfect as possible. Moreover, techniques disclosed herein can refer to, e.g., performing calculations, etc. that result in "more accurate" determinations. However, as one of ordinary skill in the art reading this document will recognize, perfection cannot always be achieved. Accordingly, these terms can also encompass making or achieving performance as good or effective as possible or practical under the given circumstances, or making or achieving performance better than that which can be achieved with other settings or parameters.

FIG. 1A illustrates an example vehicle 100 on which a solar or PV cell array 102 is disposed on the roof of vehicle 100. Solar cell array 102 may comprise one or more solar cell assemblies, examples of which are referenced as solar cell assemblies 102a, 102b, and 102c. FIG. 1A illustrates the solar cell assemblies of solar cell array 102 in their resting/un-actuated state. That is, the solar cell assemblies are laying "flat" or resting in an inactive state. It should be understood that when in a resting or inactive state, a solar cell assembly, such as solar cell assembly 102a, for example, may still be absorbing and/or converting solar energy into electricity. The resting or inactive state refers more particularly, to the orientation of the solar cell assemblies as a result of the LCE elements thereof maintaining the solar cell assemblies, in this example, in a flattened state, and not necessarily oriented purposely towards the sun. As will be described below in greater detail, and in accordance with other embodiments, LCE elements may rest/become excited in different positions, orientations, etc. In some embodiments, depending on the type(s) of LCE elements being used, the LCE elements may have a particular shape(s) or non-shape(s) in different states, whether resting or excited. For example, one LCE element may be curved in its resting state and straight in its excited state. Alternatively, one LCE element may be straight in its resting state, and curved in its excited state. It should be understood that the LCE elements (or elastomers in general) used in various embodiments are not limited to being straight or curved, but just provided for ease of description. The present disclosure contemplates the use of elastomer structures or elements that can begin as one shape and change, morph, or transition into another, or may begin as one shape having a particular size that transitions into a larger or smaller version of the same shape.

It should be understood that the placement of solar cell array 102 (and or the placement of individual solar cells or solar cell assemblies making up solar cell array 102) can vary, and need not be limited to placement on a vehicle's roof. It should also be understood that solar cell array 102 can be placed or utilized or a variety of other bodies, not limited to vehicles. For example, a solar cell array configured in accordance with various embodiments may be implemented on a bag (for use by a hiker moving through trail), an electric bicycle, scooter, or other device. Moreover, the solar cell array 102 need not be limited to use on a moving device, component, or other body. For example, utility exists in implementing one or more solar cell arrays, such as solar cell array 102 on a house, or other non-moving structure. In almost any context where solar energy is to be captured, orienting/re-orienting one or more solar cells in a heliotropic manner can increase the efficiency/performance of the one or more solar cells.

FIG. 1A further illustrates an expanded view of a single solar cell assembly in accordance with one embodiment, and will be described with reference to FIGS. 2A-2C below.

Figure 1B:
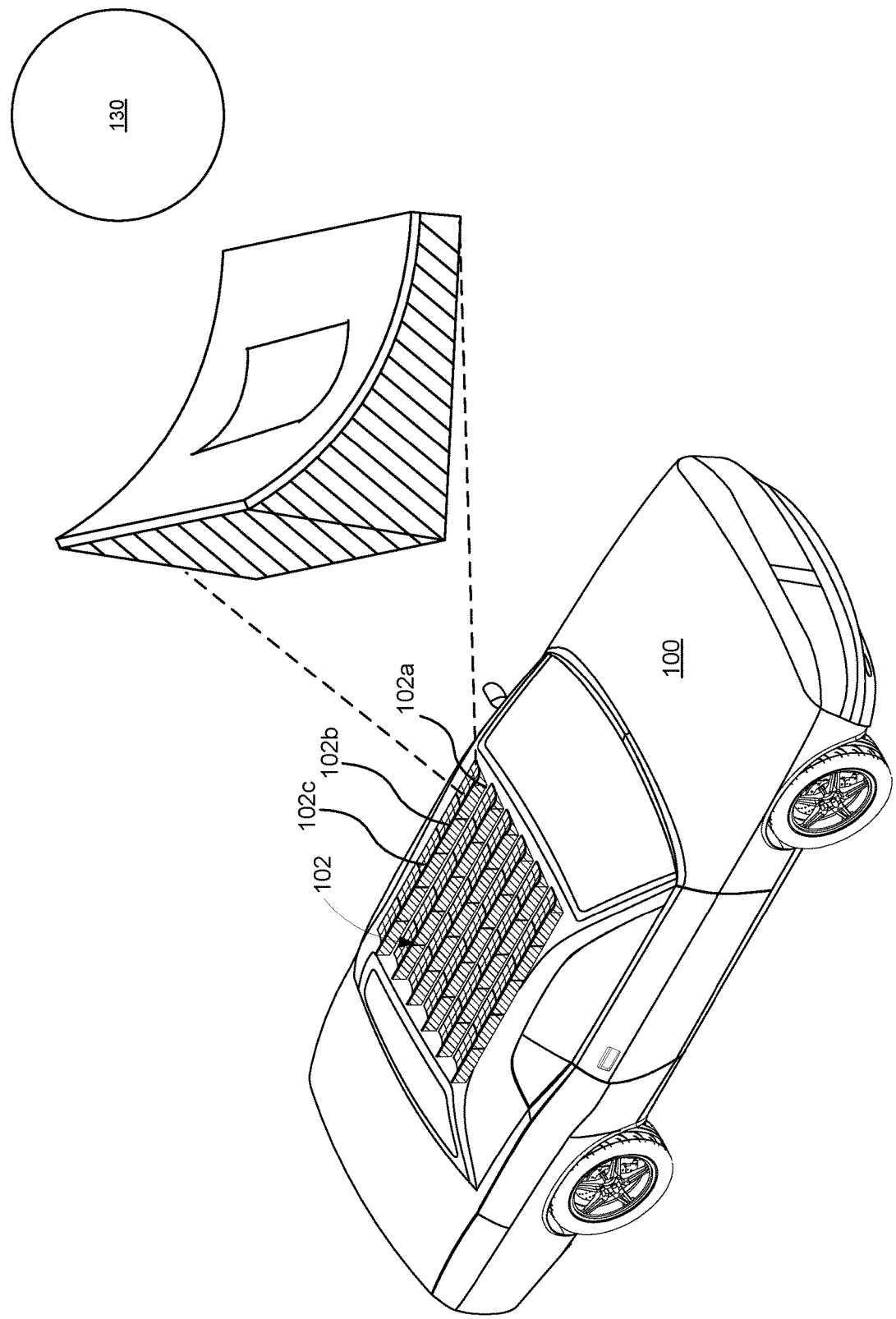
FIG. 1B is a graphical illustration of the example solar cell array of FIG. 1A in an excited state in accordance with various embodiments.

As discussed above, a solar cell assembly, e.g., solar cell assembly 102a, may, under certain conditions (depending on the direction/orientation and/or amount of sunlight or solar beams incident thereon) activate or become excited. FIG. 1B illustrates vehicle 100, where the solar cell assemblies 102a, 102b, 102c, and so on have transitioned to an active or excited state. In this excited state, and as can be appreciated by the expanded view of solar cell assembly 102a, the solar cell assembly 102a bends or curves towards the sun 130. In this way, more or more direct sunlight/solar beams may be incident on the solar cell assembly 102a. FIG. 1B illustrates all the solar cell assemblies of solar cell array 102 as being excited, and to some extent, excited to the same level, i.e., each of the solar cell assemblies are bent approximately the same amount/in the same direction. However, this is not a requirement, and again, depending on the sunlight incident on any particular solar cell assembly, one or more solar cell assemblies may be more excited than others, or some solar cell assemblies may be in a resting state, while one or more other solar cell assemblies may be in an excited state.

For example, if vehicle 100 is being driven along a route, and the sun is hidden by cloud cover, solar cell array 102 may remain "flat" in a resting state (FIG. 1A). However, if the sun comes out from the clouds, and sunlight hits solar cell array 102, one or more of the solar cell assemblies making up solar cell array 102 may orient themselves towards the direction of the sunlight. In some embodiments, alignment of a solar cell assembly with the sun/sunlight amounts to the planar area or surface of the solar cell assembly orienting itself such that the sunlight is incident upon the planar area or surface at a substantially perpendicular direction or as close to perpendicular as possible. Perpendicularity, in this context, means that sunlight will be contacting the solar cell assembly in the most-direct manner possible, resulting in the most amount of possible solar energy absorption.

Figure 2B:
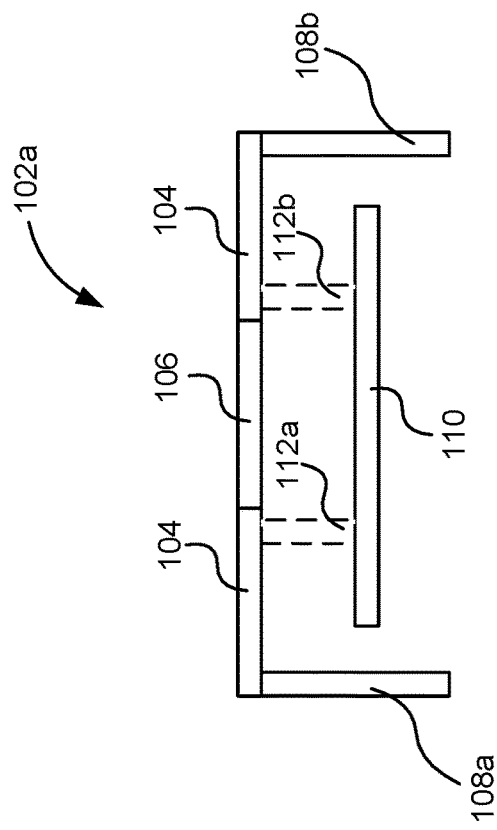
FIG. 2B is a side view of the example solar cell of FIG. 2A configured in accordance with one embodiment with dual cold mirror supports.
Figure 2C:
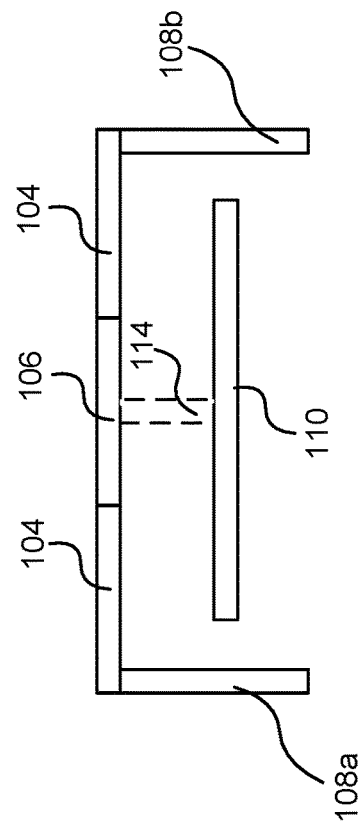
FIG. 2C is a side of the example solar cell of FIG. 2A configured in accordance with one embodiment with a single cold mirror support.
Figure 2A:
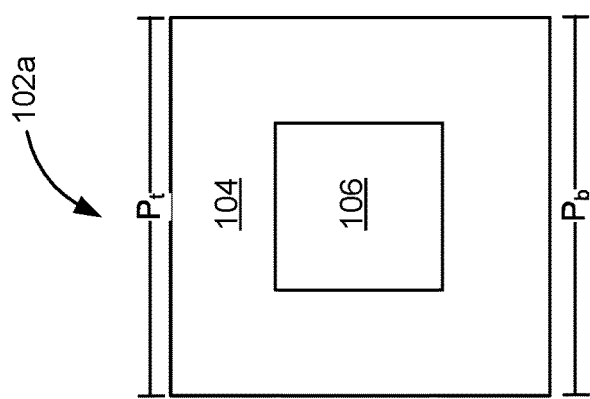
FIG. 2A is a plan view of an example solar cell configured in accordance with one embodiment.

FIG. 2A is a plan view of one of the solar cell assemblies making up solar cell array 102, e.g., solar cell assembly 102a. Solar cell assembly 102a may comprise an opaque solar cell 104. Use of opaque solar cell 104 creates an opaque region that surrounds a transparent solar cell 106. The materials/types of transparent and opaque solar cells would be known to those of ordinary skill in the art. For example, some transparent solar cells can be manufactured by thinning or segmenting conventional opaque solar cells to the point they are translucent, whereas some transparent solar cells are based on translucent or transparent materials such as glass. Transparent solar cells may also be organic PV cells. Opaque solar cells can be, e.g., crystalline silicon solar cells, thin film solar cells made of cadmium telluride, copper iridium gallium selenide, multijunction solar cells, etc. The respective efficiencies of such solar cells may also be varied depending on a desired level of heliotropism and/or efficiency of solar cell operation.

It should also be understood that this configuration of transparent solar cell 106 and opaque solar cell 104 is not limiting. For example, a plurality of opaque solar cells may be configured to provide one or more region(s) of opaque solar cell coverage, and the same may hold true for configuring a region(s) of transparent solar cell coverage. Moreover, the dimensions and/or orientation of opaque solar cell 104 and transparent solar cell 106 relative to each other and/or the solar cell assembly as a whole (or the opaque and transparent regions that one or more transparent and opaque solar cells creates) can vary depending on the heliotropic characteristics desired. For example, and as will be described below, the combination of transparent and opaque solar cell regions, at least in part, results in certain wavelengths/portions of incident sunlight behaving in a way such that the solar cell assembly 102a can optimize its orientation relative to the incident sunlight. The degree/sensitivity to which this heliotropism occurs can be altered at least in part, based on the dimensions and orientation of opaque solar cell 104 and transparent solar cell 106.

FIG. 2B is a side or cross-sectional view of solar cell assembly 102a. As illustrated in FIG. 2B, transparent solar cell 106 may be bounded by opaque solar cell 104. Additionally, LCE elements 108a and 108b may be used to support solar cell assembly 102a at one or more peripheral areas or borders along at least two edges or perimeters of opaque solar cell 104. That is, and referring back to FIG. 2A, LCE element 108a may span and support, e.g., the top border (denoted as Pt) of opaque solar cell 104, while LCE element 108b may span and support, e.g., the bottom border (denoted as Pb) of opaque solar cell 104. It should be noted that in other embodiments, one or more LCE elements may span more or less of the perimeter (or other area(s)) of opaque solar cell 104. For example, in some embodiments, a single LCE element or multiple LCE elements may span the entire periphery of opaque solar cell 104. In other embodiments, less than a total top/side/bottom border may be spanned by one or more LCE elements. In some embodiments, more or less of an area(s) of opaque solar cell 104 may be supported and ultimately moved/oriented. For example, the respective cross-sections of LCE elements 108a and 108b in FIG. 2B may be thinner or thicker. The above again, may be dependent on the desired amount of heliotropism/sensitivity to incident solar energy.

It should be understood that other materials besides LCEs can be used in some embodiments. Non-limiting examples of the types of compliant or elastomer materials that may be used include shape-memory alloys (SMAS), electroactive polymers (EAPs), piezoelectric materials, magnetic shape memory alloys, temperature-responsive polymers, ferrofluids, photomechanical materials, dielectric elastomers (DEs), among others. In some embodiments, actuators may be used, where actuators may comprise a combination of compliant and rigid materials to form compliant mechanisms capable of moving one or more regions of solar cell 102a to/from a resting state and an excited state. As a non-limiting example, an actuator can be constructed of one or more rigid structures connected by a plurality of hinges made of complaint materials. When a stimulus (in this case, sunlight) is applied to the compliant material, the hinges are configured to change shape and/or size to cause the actuator to change from a first shape to a second shape, the transformation resulting in a force being applied to cause the actuator to move to an excited state/shape.

Referring again to FIG. 2B, a dielectric mirror, e.g., a cold mirror 110 is disposed underneath transparent solar cell 106/opaque solar cell 104 and within a cavity defined by transparent solar cell 106/opaque solar cell 104 and LCE elements 108a/108b. Cold mirror 110, as noted above, may be a specialized dielectric mirror or dichroic filter that can reflect certain wavelengths and transmit/allow passage of others. For example, cold mirror 110 may reflect the entire visible light spectrum at a 45 degree angle of incidence, while efficiently transmitting infrared/near-infrared wavelengths. The shape of cold mirror 110 may be the same/similar to that of transparent solar cell 104, i.e., substantially square-shaped, or it may be configured to have another shape, whether circular, ovoid, etc. Like the other elements/aspects of solar cell assembly 102a, cold mirror 110 may be configured to suit a desired level or amount of artificial heliotropism/efficiency in solar energy collection. In some embodiments, the configuration of cold mirror 110 (along with the configuration of the other elements/aspects of solar cell array 102) can be varied in accordance with physical form factor-limitations. For example, and referring back to FIG. 1A, transportation regulations may restrict the height of protrusions from a vehicle's roof area, vehicle manufacturer's may wish to limit the amount of bend in solar cell assemblies to comport with desired vehicle aerodynamic characteristics, etc.

Cold mirror 110 may be operatively connected to one or more of the solar cells of solar cell assembly 102a. FIG. 2B illustrates an embodiment whereby cold mirror 110 is attached at two points to opaque solar cell 104. FIG. 2C illustrates an embodiment wherein cold mirror 110 is attached at one point to transparent solar cell 106. As will be described in greater detail below, certain portions/wavelengths of incident sunlight, depending on their angle of incidence are transmitted by transparent solar cell 106 into the cavity within which cold mirror 110 is located. These solar beams may be used to excite LCE 108a and/or 108b. Thus, cold mirror supports 112a, 112b, and 114, may also be transparent or translucent to allow the desired passage of sunlight. Those of ordinary skill in the art would know what materials would appropriate to use as cold mirror supports 112a, 112b, and 114. Cold mirror supports 112a, 112b, and 114 may be some clear polymer material, some type of glass, etc. As is the case with other elements of solar cell assembly 102a, the characteristics (shape, level of transparency with respect to wavelength, etc.) and orientation of cold mirror supports 112a, 112b, and 114 can be altered to achieve a desired level of artificial heliotropism.

The manner in which cold mirror supports 112a, 112b, and 114 can be adhered to transparent solar cell 106 and/or opaque solar cell 104 using some form of transparent/translucent adhesive to again, allow the desired transmission of light/wavelengths of light. For example, a clear-drying epoxy or glue could be used in some embodiments. In some embodiments, the cold mirror supports 112a, 112b, and 114 themselves may be heated to some melting point and adhered to transparent solar cell 106 and/or opaque solar cell 104 without using a separate adhesive agent or material. In some embodiments, an adhesive material, such as a clear tape may be used.

FIGS. 3A and 3B illustrate solar cell assembly 102a in resting and excited states, respectively. It should be noted that FIGS. 3A and 3B omit representations of the cold mirror support(s) for ease of illustration. FIG. 3A illustrates solar cell assembly 102a in a resting state, e.g., when sunlight is initially incident upon transparent solar cell 106 and opaque solar cell 104. Prior to this, solar cell assembly 102a may be in a resting state due to a lack of sunlight or if sunlight is present, the angle of incidence and/or intensity of the sunlight is insufficient to excite solar cell 102a to bend/engage in heliotropism (although there still may be some amount of solar energy absorption that is occurring). Beams or rays of sunlight 120 are illustrated as being incident upon transparent solar cell 106 and opaque solar cells 104 at an oblique angle, e.g., in this case, approximately a 45 degree angle (although as would be understood, sunlight can hit upon transparent solar cell 106 and opaque solar cells 104 at nearly any angle). Beam 120a will be referenced for explanation purposes.

A beam of sunlight, e.g., beam 120a may comprise different wavelengths. That is, sunlight has a spectral composition that includes ultraviolet wavelengths (UV A, B, and C), a visible range, and an infrared range. As illustrated in FIGS. 3A and 3B, beam 120a may be incident upon transparent and opaque solar cells 106, 104. Opaque solar cell 104 may absorb some of the ultraviolet wavelengths, e.g., in the low to low-middle wavelengths, resulting in conventional solar energy absorption. The transparent solar cell 106 may absorb only the lower wavelength portion of beam 120a, e.g., the UV C to UV B ranges, allowing the higher wavelength portions, i.e., beam 120a-1 (UV A, visible and infrared ranges) to pass through to cold mirror 110. It should be noted that the components (solar cells, cold mirrors, cold mirror supports, etc.) making up a solar cell assembly can vary and/or be configured to have varying operational characteristics. For example, certain transparent solar cells may pass certain wavelengths of incident sunlight, while another type/configuration of solar cells may pass other wavelengths (perhaps with overlap). The manner in which LCE elements 108a/108b are desired to be stimulated, the amount by which they are desired to transform, the size(s) of the solar cell assemblies/solar cell array, etc. may impact a particular configuration of a solar cell array in accordance with various embodiments. Accordingly, the amounts and/or the particular wavelengths of light that may be absorbed, transmitted, and/or reflected can vary in different embodiments. For example (and not meant to be limiting in any way), the embodiments described herein may generally result in minimal overlap between the absorption wavelengths of the opaque solar cell 104, the transparent solar cell 106, and the LCEs 108a, 108b. In other embodiments, the opaque solar cell 104 may have a broad absorption coefficient (see 210 of FIG. 5) that overlaps with the absorption spectrum of other components of solar cell assembly 102a. Because opaque solar cell 104 absorbs sunlight present in the environment, it can be tuned to absorb as much incident sunlight as possible. As illustrated in, e.g., FIGS. 3A and 3B, and as described herein, the sunlight (or portion(s) thereof) that excite LCEs 108a and 108b are passed by transparent solar cell 106. Accordingly, the broad absorption coefficient 210 of opaque solar cell 104 in such an embodiment would no conflict with excitation of LCEs 108a and 108b.

Cold mirror 110 may generally transmit wavelengths that match the absorption wavelengths of LCEs 108a and 108b. For example, because the cold mirror is used in embodiments to transmit the wavelengths used to excite the LCE elements 108a, 108b, the cold mirror should be configured to transmit those wavelengths so they may reach LCE elements 108a and 108b. Cold mirror 110 reflects wavelengths of beam 120a in the visible range, i.e., beam 120a-2 towards the underside of opaque solar cell 104, which opaque solar cell 104 will absorb, resulting in more efficient solar energy collection/absorption. Additionally, cold mirror 110 allows the infrared range of wavelengths of beam 120a, i.e., beam 120a-3, to pass through to LCE 108a which absorbs beam 120a-3.

As a result of LCE 108a absorbing beam 120a-3, LCE 108a becomes excited and bends towards the direction of sunlight incident on solar cell assembly 102a so that sunlight 120 hits solar cell assembly 102a at a more perpendicular angle (rather than the previously more obtuse angle). The connection between the solar cell(s) and the cold mirror allows the cold mirror to remain in the same position relative to the solar cell(s) whether the solar cell assembly is in a resting or excited state. In this way, the reflection/filtering performed by the cold mirror can be maintained while the solar cell assembly transitions to and achieves alignment with incident sunlight 120.

In the illustrated example, LCE element 108b remains in its resting state. The excitation of LCE element 108a and the non-excitation of LCE element 108b results, as described above, in solar cell assembly being bent or oriented towards incident sunlight 120. It should be appreciated that when the vehicle on which solar cell assembly 102a is positioned and/or upon movement of the sun relative to solar cell assembly 102a, at some point, LCE 108b may become excited, expand/bend, and force solar cell assembly 102a to reorient itself in the opposite direction or follow the incident sunlight 120. In this way, optimal solar absorption by solar cell assembly 102a can be achieved.

It should be noted that opaque solar cell 104 may be made of a relatively inflexible material, and so may be disposed on a flexible substrate to achieve this bending effect. In some embodiments, transparent solar cell 106 may also be relatively inflexible and so may also be disposed on a flexible substrate (not shown), although in other embodiments, a flexible transparent solar cell material may be utilized. Ultimately, even if opaque and transparent solar cells 104 and 106 are relatively inflexible, can be made to move as segments effectuating, for all intents and purposes, a bend. In other embodiments more flexible materials may be used to construct both opaque and transparent solar cells 104 and 106 so that the bending effect can be achieved as described in greater detail below.

Figure 3C:
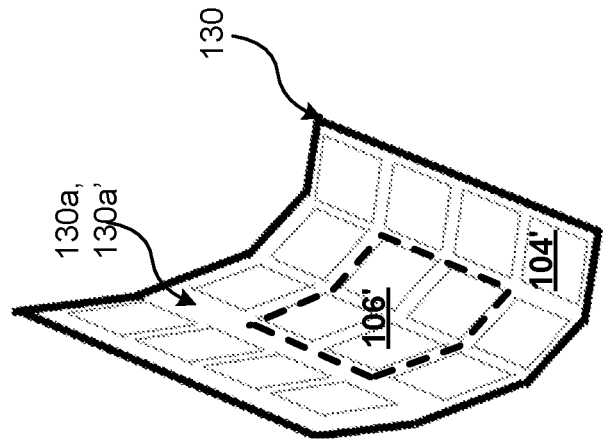
FIG. 3C illustrates an example flexible substrate on which solar cells may be disposed in accordance with one embodiment.
Figure 3C:
Figure 3C:
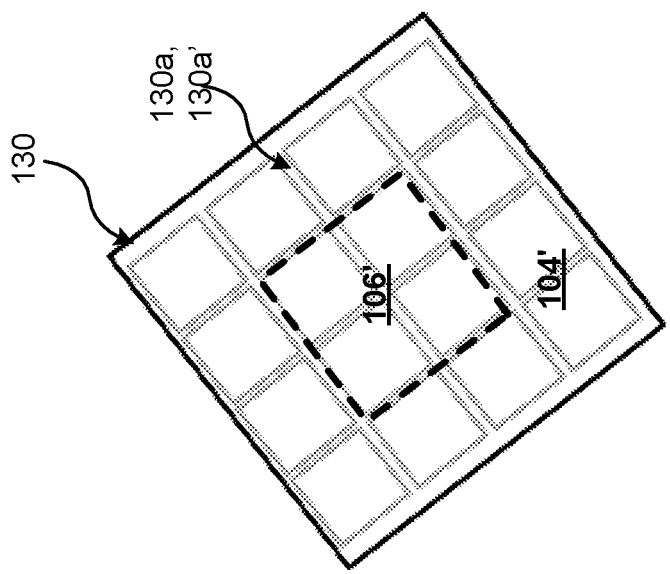

FIG. 3C illustrates an example flexible substrate 130 on which solar cells may be disposed in accordance with various embodiments. Some materials comprising opaque solar cell 104 and/or transparent solar cell 106 may be rigid or at least, not flexible enough on their own to conform or deform commensurate with movement effectuated by excitement of LCE 108a or 108b. Accordingly, in some embodiments, transparent solar cell 106 and/or opaque solar cell 104 (or a plurality of transparent and/or opaque solar cells making up a transparent solar cell region commensurate with the area of transparent solar cell 106 and an opaque solar cell region commensurate with the area of opaque solar cell 104) may be disposed on a flexible substrate, such as polydimethylsiloxane (PDMS). PDMS refers to a silicon-based organic polymer that has viscoelastic properties that allow it bend, move, or in general act like an elastic solid, similar to rubber. Additionally, PDMS is optically clear, and in general, inert, non-toxic, and non-flammable. Further still, PDMS, configured as a membrane that is, e.g., 1 cm thick, absorbs less than 5% of incident UV illumination for the wavelength ranging from about 365 to 436 nm. Practically speaking, PDMS is transparent to UV radiation/light in this wavelength range. In fact, PDMS generally has low absorption across all wavelengths past 250 nm, meaning it is transparent to UV A light, partially transparent to UV B light, and transparent to visible light. As used in some embodiments, with opaque solar cells (e.g., opaque solar cell 104) and LCEs, e.g., LCEs 108a, 108b, that work primarily with wavelengths above the UV B light spectrum, PDMS acts as a transparent substrate without interfering with the solar absorption process described herein.

FIG. 3C illustrates one example configuration of the solar cell aspect of a solar cell assembly, such as solar cell assembly 102a. In particular, opaque solar cell tiles 104' may be disposed on flexible substrate 130 (which again, may be a PDMS substrate) surrounding transparent solar cell tiles 106' that may also be disposed on flexible substrate 130. As can be appreciated, the resulting configuration of transparent and opaque solar cell tiles effectively mimics that of transparent solar cell 106 and opaque solar cell 104 of solar cell assembly 102a, with the characteristic of being able to be bent (to effectuate artificial tropism). It should be noted that in the example configuration of FIG. 3C, gaps 130a between transparent solar cell tiles 106' and opaque solar cell tiles 104' may exist on flexible substrate 130. Because, as discussed above, PDMS is transparent to certain wavelengths of light, undesired stimulation/excitation of LCEs 108a and/or 108b may result upon incident sunlight 120 hitting solar cell assembly 102a. Thus, in some embodiments, a reflective film may be incorporated as part of flexible substrate 130. For example, a reflective film may be disposed atop or below flexible substrate 130 resulting in reflective areas 130a' where without the reflective film, gaps 130a would remain. In this way, no unintended transmission of light occurs through flexible substrate 130. In some embodiments, the reflective film may be a known window film used in automotive applications, such as 3M Automotive Window Film Crystalline Series, which purportedly reflects up to 97% of infrared and UV light. Thus, only incident sunlight beams intended to pass through to LCEs 108a, 108b actually pass through transparent solar cell tiles 106', allowing artificial tropism to occur as described herein.

Figure 4A:
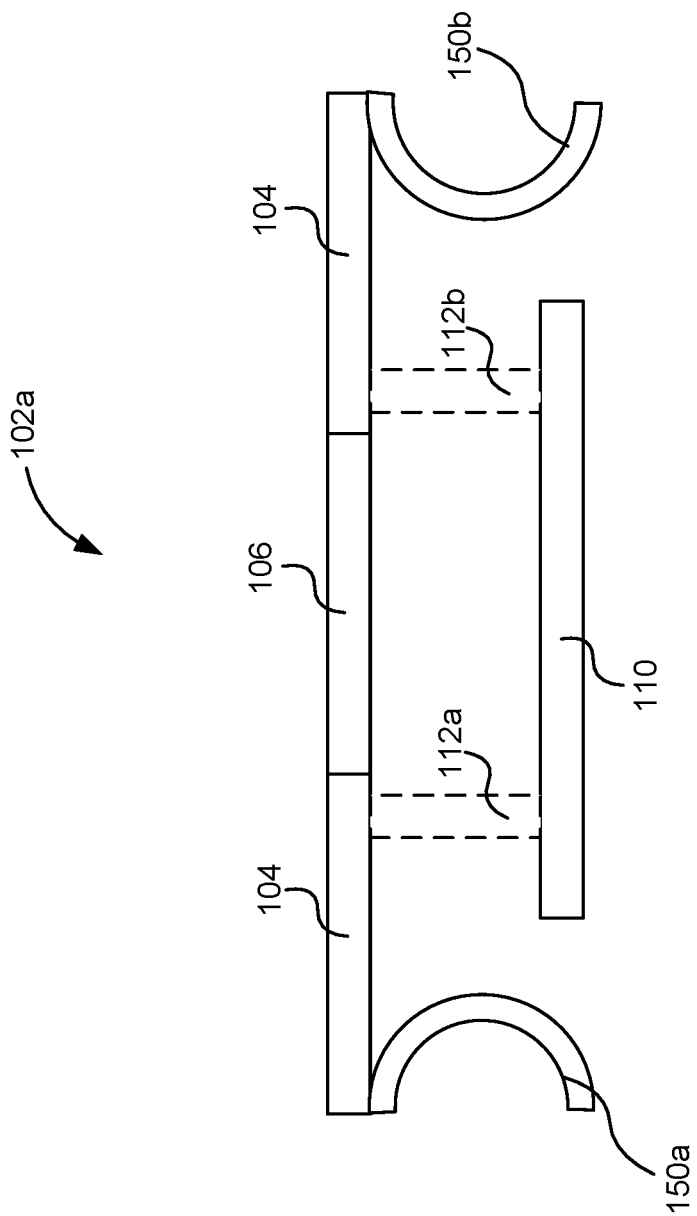
FIG. 4A is a side view of the example solar cell configured in accordance with another embodiment with dual cold mirror supports.

FIG. 4A illustrates another embodiment of solar cell assembly 102a, where polymer elements 150a and 150b may be light-reactive polymers (also referred to as photopolymers) instead of LCE elements. The properties of these types of polymers can change upon exposure to light, often in the UV or visible regions of light. For example, a photopolymer may undergo conformation (like LCEs) upon exposure to light, in this case, sunlight. Accordingly, similar to the elastomer elements described above, polymer elements 150a and 150b may change shape upon exposure to a stimulus, such as sunlight (or some wavelength/portion of sunlight), to effectuate passive tracking of incident sunlight by the solar cell(s) supported by polymer elements 150a and/or 150b. As illustrated in FIG. 4A, a cold mirror 110 may be attached to opaque solar cell 104 by cold mirror supports 112a and 112b. As with other embodiments described above, where LCE elements or structures are used to operatively connect cold mirror 110 to one or more of the transparent and/or opaque solar cells 106 and 104, different configurations for supporting and positioning cold mirror 110 are contemplated.

Figure 4B:
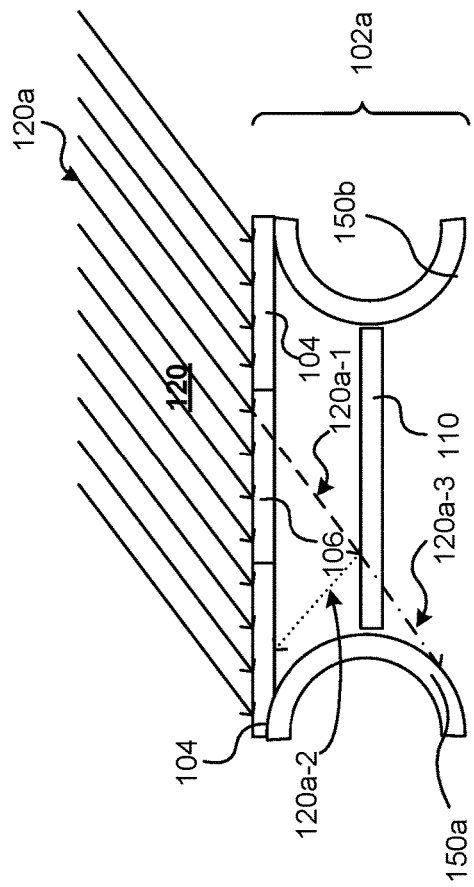
FIG. 4B illustrates solar beams incident on the example solar cell of FIG. 4A in its resting state.
Figure 4C:
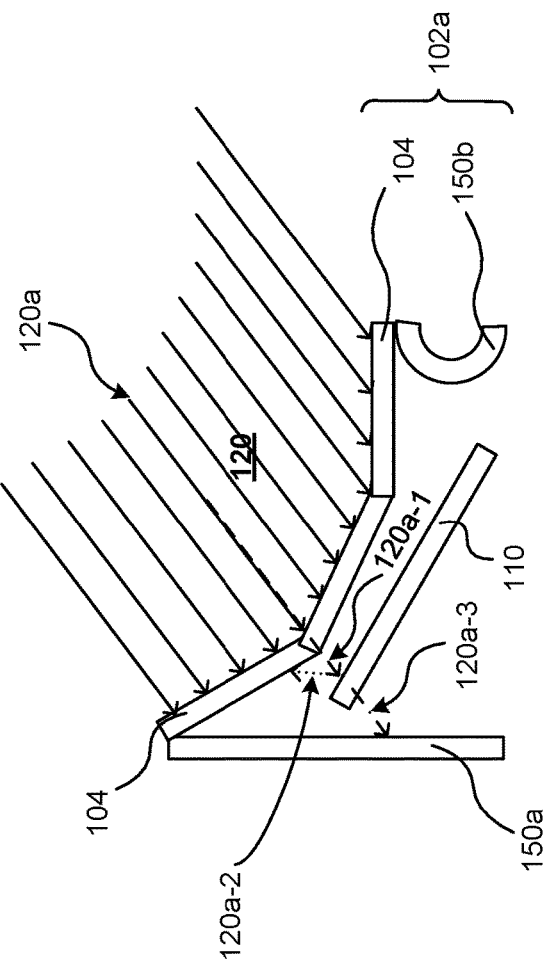
FIG. 4C illustrates solar beams incident on the example solar cell of FIG. 4A in its excited state.

FIGS. 4B and 4C illustrate solar cell assembly 102a in resting and excited states, respectively. It should be noted that FIGS. 4B and 4C omit representations of the cold mirror support(s) for ease of illustration. FIG. 4B illustrates solar cell assembly 102a in a resting state, e.g., when sunlight is initially incident upon transparent solar cell 106 and opaque solar cell 104. Prior to this, solar cell assembly 102a may be in a resting state due to a lack of sunlight or if sunlight is present, the angle of incidence and/or intensity of the sunlight is insufficient to excite solar cell 102a to bend/engage in heliotropism (although there still may be some amount of solar energy absorption that is occurring). Beams or rays of sunlight 120 are illustrated as being incident upon transparent solar cell 106 and opaque solar cells 104 at an oblique angle, e.g., in this case, approximately a 45 degree angle (although as would be understood, sunlight can hit upon transparent solar cell 106 and opaque solar cells 104 at nearly any angle). Again, one beam, i.e., beam 120a, will be referenced for explanation purposes.

As illustrated in FIGS. 4B and 4C, beam 120a may be incident upon transparent and opaque solar cells 106, 104. Opaque solar cell 104 may absorb some of the ultraviolet wavelengths, e.g., in the low to low-middle wavelengths, resulting in conventional solar energy absorption. The transparent solar cell 106 may absorb only the lower wavelength portion of beam 102a, e.g., the UV C to UV B ranges, allowing the higher wavelength portions, i.e., beam 120a-1 (visible and infrared ranges) to pass through to cold mirror 110. Cold mirror 110 reflects wavelengths of beam 120a in the visible range, i.e., beam 120a-2, towards the underside of opaque solar cell 104, which opaque solar cell 104 will absorb, resulting in more efficient solar energy collection/absorption. Additionally, cold mirror 110 allows the infrared range of wavelengths of beam 120a, i.e., beam 120a-3, to pass through to polymer element 150a which absorbs beam 120a-3. In contrast to LCE element 108a of FIGS. 3A and 3B, where in its resting state, LCE element 108a is oriented in a vertically straight fashion, polymer element 150a in its resting state is oriented in a curved "C" shape.

As a result of polymer element 150a absorbing beam 120a-3, polymer element 150a becomes excited and straightens in a vertical/upward direction or orientation such that incident sunlight 120 hits solar cell assembly 102a at a more perpendicular angle (rather than the previously more obtuse angle). The connection between the solar cell(s) and the cold mirror allows the cold mirror to remain in the same position relative to the solar cell(s) whether the solar cell assembly is in a resting or excited state. In this way, the reflection/filtering performed by the cold mirror can be maintained while the solar cell assembly transitions to and achieves alignment with incident sunlight 120.

It should be noted that although embodiments described herein refer to combinations of the same types of elastomer/light-stimulated elements for effectuating movement of the solar cell assembly, other embodiments contemplate a combination of different types of elastomer/light-stimulated elements. For example, in some embodiments, a solar cell assembly, e.g., solar cell assembly 102a, may comprise one LCE, e.g., LCE 108a, and one polymer element 150b. Particular configurations of solar cell assembly 102a (including what light-excitable elements for effectuating the artificial tropism may be used, arrangement of the light-excitable elements and/or other components) can be based on various factors. For example, the use of different types of LCEs, shape-changing elements, and/or photopolymers may be premised on the particular environmental conditions most likely to be experienced by solar cell assembly 102a. That is, the angle of incidence of sunlight generally would hit solar cell assembly 102a may influence the use of certain materials with certain absorption and/or transmission characteristics. Environments that generally receive more sunlight than others (e.g., more arid regions) may mean that solar energy collection is easier, and thus the artificial tropism effectuated in accordance with various embodiments may not need to be as sensitive. Battery capacity may also play a factor. Again, solar cell assembly 102a may be able to gather more solar energy and/or over a shorter period of time in sunnier regions, and batteries may only be able to store a particular amount of energy. Accordingly, if battery capacity is easily met, again, solar cell assembly 102a may not need to be as sensitive.

Figure 5:
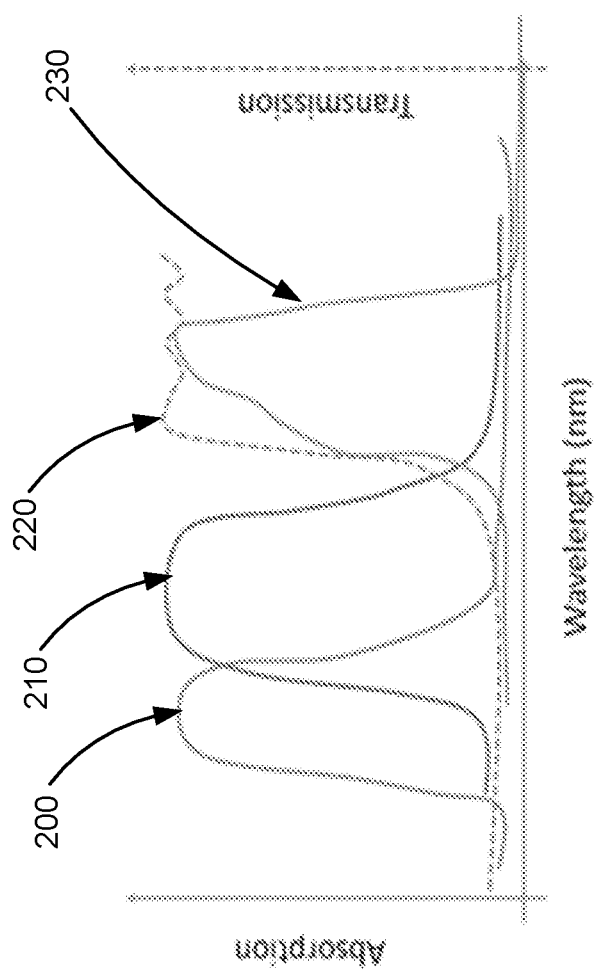
FIG. 5 is an example graph illustrating absorption and transmission of sunlight incident on an example solar cell assembly in accordance with one embodiment.

FIG. 5 is an example graph representing the different spectral components of sunlight as they pass through (transmission) one or more elements of a solar cell assembly configured in accordance with various embodiments and/or are absorbed by one or more elements of the solar cell assembly. As illustrated in FIG. 5, a transparent solar cell (e.g., transparent solar cell 106) or transparent solar cell region will only absorb the spectral portion of sunlight in the UV wavelength range 200, e.g., UV C and UV B ranges. The remaining spectral components of sunlight, e.g., components in the UV A, visible, and infrared ranges, may pass through the transparent solar cell/region. The opaque solar cell/region may absorb spectral components of sunlight falling within the "mid-range" of wavelengths, e.g., UV A and visible light wavelength range 210, allowing infrared light to pass through. The LCE element(s) or the photopolymer elements may absorb the light in the infrared wavelength range 230, while a cold mirror would transmit infrared light (denoted as 220 and generally coinciding with 230) and reflect the aforementioned "mid-range" wavelengths, e.g., visible light, and possible some UV A radiation.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional or physical partitioning and configurations can be implemented to implement the desired features of the technology disclosed herein. Also, a multitude of different constituent module names other than those depicted herein can be applied to the various partitions.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A solar cell assembly adapted to passively track the sun, the solar cell assembly comprising:
    at least one opaque solar cell surrounding a transparent solar cell, the transparent solar cell and the opaque solar cell forming a solar absorption section having a first surface facing incident sunlight, and a second surface opposite the first surface;
    a cold mirror disposed beneath the second surface of the solar absorption section, the cold mirror being oriented such that a surface of the cold mirror facing the second surface of the solar absorption section is substantially parallel to the second surface of the solar absorption section, the cold mirror splitting the incident sunlight passing through the transparent solar cell into a first set of one or more beams that are reflected back to the opaque solar cell at the second surface, and a second set of one or more beams that are passed through the cold mirror and that actuate at least one shape-changing element supporting a first portion of the solar absorption section, where upon actuation of the at least one shape-changing element, the first portion of the solar absorption section is oriented such that the incident sunlight contacts the first surface substantially perpendicularly.

2. The solar cell assembly of claim 1, wherein the at least one shape-changing element comprises a liquid crystal elastomer, and wherein the second set of the one or more beams stimulates the liquid crystal elastomer.

3. The solar cell assembly of claim 2 wherein the liquid crystal elastomer, when actuated at least one of increases in length and curves toward a direction of the incident sunlight.

4. The solar cell assembly of claim 1 further comprising at least one other shape-changing element support a second portion of the solar absorption section.

5. The solar cell assembly of claim 4, wherein the at least one other shape-changing element remains in an un-actuated state.

6. The solar cell assembly of claim 5, wherein upon a direction from which the incident sunlight originates changes, a third set of one or more beams that are passed through the cold mirror actuate the at least one other shape-changing element.

7. The solar cell assembly of claim 6, wherein the at least one other shape-changing element, when actuated, at least one of increases in length and curves toward the changed direction from which the sunlight originates.

8. The solar cell assembly of claim 7, wherein the at least one shape-changing element transitions to an un-actuated state.

9. The solar cell assembly of claim 1, wherein the at least one shape-changing element comprises a polymer, the polymer capable of being excited by the second set of the one or more beams that are passed through the cold mirror, the excitation of the polymer resulting in the actuation of the polymer.

10. The solar cell assembly of claim 1, wherein the at least one shape-changing element comprises a shape-memory alloy, the shape-memory alloy capable of being excited by the second set of the one or more beams that are passed through the cold mirror, the excitation of the shape-memory alloy resulting in the actuation of the shape-memory alloy.

11. The solar cell assembly of claim 1 further comprising a cold mirror support member supporting the cold mirror such that an orientation of the cold mirror relative to the second surface of the solar absorption surface remains substantially constant throughout the actuation of the at least one shape-changing element.

12. The solar cell assembly of claim 1, wherein the cold mirror support member comprises a material whose characteristic transparency matches that of the transparent solar cell.

13. The solar cell assembly of claim 1 further comprising a plurality of cold mirror support members supporting the cold mirror such that an orientation of the cold mirror relative to the second surface of the solar absorption surface remains substantially constant throughout the actuation of the at least one shape-changing element.

14. The solar cell assembly of claim 1, wherein each of the plurality of cold mirror support members comprises a material whose characteristic transparency matches that of the transparent solar cell.

15. The solar cell assembly of claim 1, wherein at least one of the at least one opaque solar cell and the at least one transparent solar cell is disposed on a flexible substrate, the flexible substrate having incorporated thereon a reflective film.

16. The solar cell assembly of claim 15, wherein the flexible substrate is transparent and the reflective film preventing unintended transmission of the incident sunlight through the flexible substrate.

17. A solar cell array, comprising:
   at least one solar cell assembly, the at least one solar cell assembly comprising:
      at least one opaque solar cell, and at least one transparent solar cell, the at least on transparent solar cell and the at least one opaque solar cell forming a first surface of a solar absorption surface facing the incident sunlight;
      a cold mirror positioned substantially parallel relative to a second surface of the solar absorption surface, the cold mirror reflecting a first wavelength of the incident sunlight passing through the at least one transparent solar cell towards the at least one opaque solar cell, and transmitting a second wavelength of the incident sunlight, the second wavelength of the incident sunlight causing at least one shape-changing element to undergo conformation such that the first surface is oriented towards the direction of the incident sunlight.

18. The solar cell array of claim 17, wherein the at least one shape-changing element comprises at least one of a liquid crystal elastomer reactive to light stimuli, a photopolymer reactive to light stimuli, and a shape-changing element reactive to light stimuli.

19. The solar cell array of claim 17, wherein the at least one solar cell assembly further comprises at least one cold mirror support member maintaining the cold mirror's position relative to the second surface of the solar absorption surface.

20. The solar cell array of claim 17, wherein at least one of the at least one opaque solar cell and the at least one transparent solar cell is disposed on a flexible substrate, the flexible substrate having incorporated thereon a reflective film.

* * * * *